United States Patent [19]
Suzuki

[11] Patent Number: 5,973,571
[45] Date of Patent: Oct. 26, 1999

[54] SEMICONDUCTOR INTEGRATED CIRCUIT HAVING A PHASE LOCKED LOOP

[75] Inventor: Kazumasa Suzuki, Tokyo, Japan

[73] Assignee: NEC Corporation, Tokyo, Japan

[21] Appl. No.: 09/028,515

[22] Filed: Feb. 23, 1998

[30] Foreign Application Priority Data

Feb. 27, 1997 [JP] Japan ................................. 9-044127

[51] Int. Cl.⁶ ................................. H03L 7/06; H03L 7/18
[52] U.S. Cl. .................................. 331/17; 331/8; 331/25; 331/44; 331/74
[58] Field of Search .................... 331/8, 17, 23, 331/25, 44, 74; 329/325, 326

[56] References Cited

U.S. PATENT DOCUMENTS

| | | | |
|---|---|---|---|
| 4,410,861 | 10/1983 | Werner | 331/25 |
| 5,295,079 | 3/1994 | Wong et al. | 364/484 |
| 5,543,761 | 8/1996 | Klughart | 331/44 |
| 5,625,319 | 4/1997 | Miki | 329/325 |

FOREIGN PATENT DOCUMENTS

| | | |
|---|---|---|
| 2-32078 | 2/1990 | Japan . |
| 2-157675 | 6/1990 | Japan . |
| 3-33378 | 4/1991 | Japan . |
| 3-175819 | 7/1991 | Japan . |
| 3-222520 | 10/1991 | Japan . |
| 4-259870 | 9/1992 | Japan . |
| 5-299988 | 11/1993 | Japan . |
| 7-120533 | 5/1995 | Japan . |
| 7-262789 | 10/1995 | Japan . |

Primary Examiner—David Mis
Attorney, Agent, or Firm—Whitham, Curtis & Whitham

[57] ABSTRACT

A phase locked loop in a LSI comprises a phase comparator, a low-pass filter, a voltage controlled oscillator and a frequency divider, and receives an input clock signal to output an internal clock signal obtained by multiplication of the input clock signal. The output of the low-pass filter is supplied through a voltage follower from an external pin toward outside the integrated circuit. The output voltage of the low-pass filter is evaluated during a test mode for evaluating the function of the phase locked loop without affecting the characteristics of the phase locked loop.

7 Claims, 5 Drawing Sheets

5,973,571

SEMICONDUCTOR INTEGRATED CIRCUIT HAVING A PHASE LOCKED LOOP

BACKGROUND OF THE INVENTION (a) Field of the Invention

The present invention relates to a semiconductor integrated circuit having a phase locked loop and, more particularly, to a circuit structure for testing the phase locked loop.

(b) Description of the Related Art

A semiconductor integrated circuit, such as a logic LSI, generates an internal clock signal having a higher frequency than an input clock signal to operate the internal circuit thereof, such as a microprocessor or digital signal processor. For this purpose, a phase locked loop is generally used which multiplies the frequency of the input clock signal to provide the higher frequency clock signal which is in synchrony with the input clock signal. Some phase locked loops operate in an analog format, and it is generally important to test the phase locked loop by using a logic tester or analog tester to evaluate the characteristics of the phase locked loop.

FIG. 1 shows a conventional analog phase locked loop 13 incorporated in a logic LSI 11, which is under an evaluation test by a logic tester 29. The logic LSI 11 comprises an internal circuit 12 and a phase locked loop 13 for supplying an internal clock signal 104 to the internal circuit 12. The phase locked loop 13 comprises a phase comparator 15 for comparing an internal signal 105 against an input clock signal, a low-pass filter 16 receiving an analog output from the phase comparator 15, a voltage controlled oscillator (VCO) 17 controlled by an output 102 from the low-pass filter 16 to supply an internal clock signal 104 to the internal circuit 12, and a frequency divider 18 for dividing the frequency of an output 104 from the VCO 17 to provide the internal signal 105 to the comparator 15.

In a normal operation mode of the logic LSI 11, an input clock signal is supplied to the phase comparator 15, which outputs a phase difference signal representing the phase difference between the input clock signal and the internal signal 105 through the low-pass filter 16 to the VCO 17. The VCO 17 is controlled by the output 102 of the low-pass filter 16 to supply the internal clock signal 104 having a multiplied frequency which is a product of frequency of the input clock signal by a multiplication factor equal to the dividing ratio by the frequency divider 18.

In the evaluation test mode of the logic LSI 11, a driver 31 in the logic tester 29 supplies a test clock signal 101 to the phase comparator 15 of the phase locked loop 13. The output clock signal 104 of the VCO 17 is supplied to a comparator 30 of the logic tester 29, which evaluates the output clock signal 104 by judging whether or not the level of the output clock signal 104 resides within an expected range at a specified timing.

FIG. 2 shows a timing chart for the test mode of the logic LSI 11, wherein three examples for the test output signal 104, which are obtained by multiplication of the frequency of the test clock signal 101 by two, are shown together with the test clock signal 101. The timing chart also shows the specified timing of the evaluation for each of the examples by an arrow, as well as the results of the judgement in the examples, namely, "pass" or "fail". The first example shows a "pass" wherein the level of each clock pulse is judged to be correct at each specified timing, and the second example shows a "fail" wherein some clock pulses are judged to be incorrect because of the incorrect frequency of the output clock signal 104, which may cause a malfunction of the internal circuit 12.

The third example shows a "fail" determined by the logic tester 29 wherein the level of each clock pulse is judged to be incorrect, although the output clock frequency itself is correct and, therefore, there is no possible malfunction in the internal circuit 12 caused by the judged incorrect level of each clock pulse.

The logic LSI 11 of FIG. 1 can be tested also by an analog test circuit including an oscillator and a voltmeter such as shown in FIG. 3, as described in Utility Model Kokai Publication 2–32078. The oscillator 20 supplies a test clock signal 101 to the phase comparator 15, as in the case of the logic tester of FIG. 1, and the voltmeter 19 determines the voltage level of the output 102 of the low-pass filter 16 controlling the output frequency from the VCO 17.

FIG. 4 is a typical graph for showing the output frequency of the VCO against the output voltage of the low-pas filter, i.e., input control voltage of the VCO. The output frequency monotonically increases from a minimum frequency $f_{min}$ to a maximum frequency $f_{max}$ with the increase of the input control voltage of the VCO. Especially in the range between VB and VA, the VCO operates in a stable and normal state so that the output frequency is determined by the input control voltage. In the graph, assuming that the design frequency of the VCO 17 is $f_x$ and the dividing factor by the divider 18 is ½ in the example of FIG. 3, a frequency of $f_x/2$ is supplied as the input test clock signal 101 from the oscillator 20. In this case, if the input control voltage (VX) resides between VB and VA, as shown in FIG. 5, the phase locked loop 13 operates in a stable and normal state. On the other hand, if the input control voltage (VX') does not reside between VB and VA, as shown in FIG. 5, the phase locked loop 13 does not operate in a stable and normal state. Namely, by measuring the input control voltage of the VCO 17, the phase locked loop 13 can be evaluated in its operation.

In the evaluation by the analog tester of FIG. 3, it is to be noted that if the voltmeter 19 has an input impedance comparable with or lower than the output impedance of the low-pass filter 16 or the input impedance of the internal circuit 12, the measurement by the voltmeter 19 is not satisfactory in its reliability. Accordingly, voltmeter 19 must have a sufficiently high input impedance to obtain a reliable result for the evaluation test.

SUMMARY OF THE INVENTION

It is an object of the present invention to provide a semiconductor integrated circuit comprising a phase locked loop which allows a reliable test for evaluation of oscillation frequency by an analog tester or a logic tester.

The present invention provides a semiconductor integrated circuit comprising: an internal circuit having a specified function; a phase locked loop having a phase comparator for comparing an input clock signal against an internal signal in phase to output a phase difference signal, a low-pass filter for passing low-frequency components of the phase difference signal as a first signal, a voltage controlled oscillator (VCO) for receiving the first signal to output an internal clock signal to the internal circuit based on a voltage level of the first signal, and a frequency divider for dividing the internal clock signal to output the internal signal; and an impedance converter for receiving the first signal at a first impedance to output a test evaluation signal to be supplied substantially without affecting the first impedance.

In accordance with the semiconductor integrated circuit of the present invention, a reliable evaluation test can be obtained by measuring the output of the impedance converter which does not substantially affect the input control voltage of the VCO.

The above and other objects, features and advantages of the present invention will be more apparent from the following description, referring to the accompanying drawings.

PREFERRED EMBODIMENTS OF THE INVENTION

Figure 1:
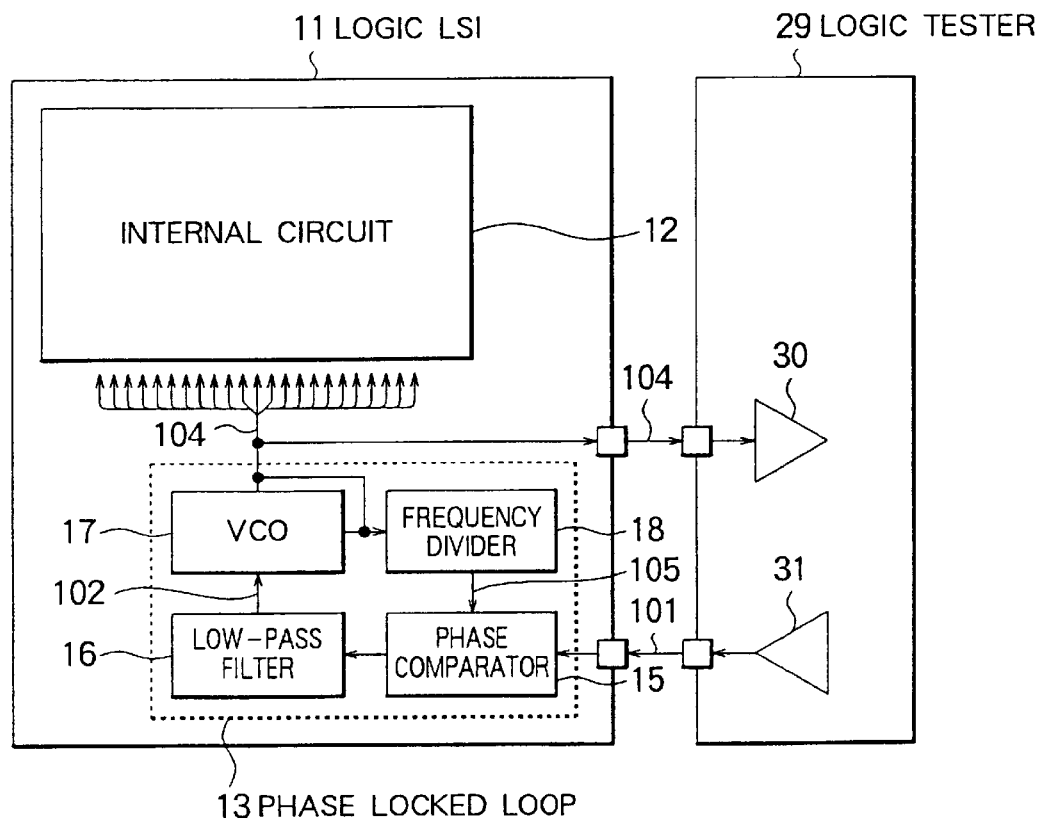
FIG. 1 is a block diagram of a conventional logic LSI under an evaluation test by a logic tester.
Figure 2:
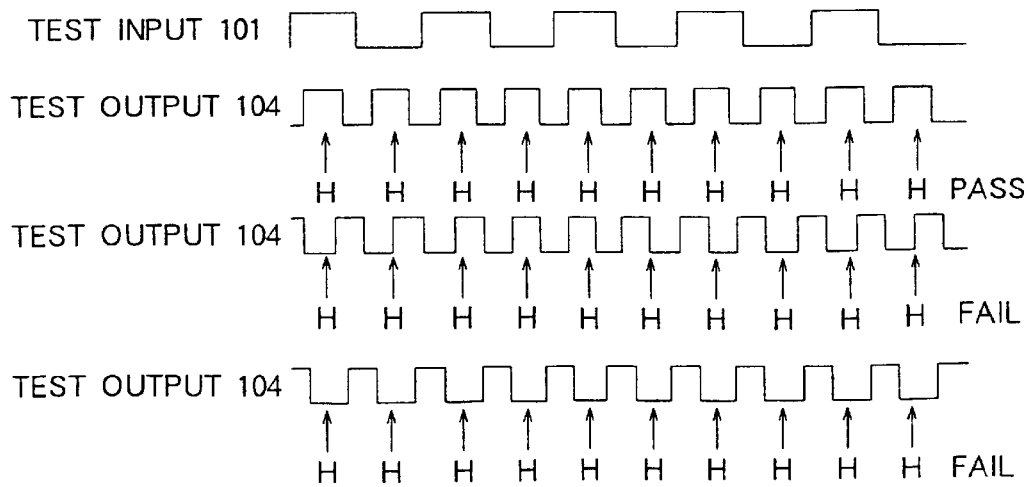
FIG. 2 is a timing chart of the test shown in FIG. 1.
Figure 3:
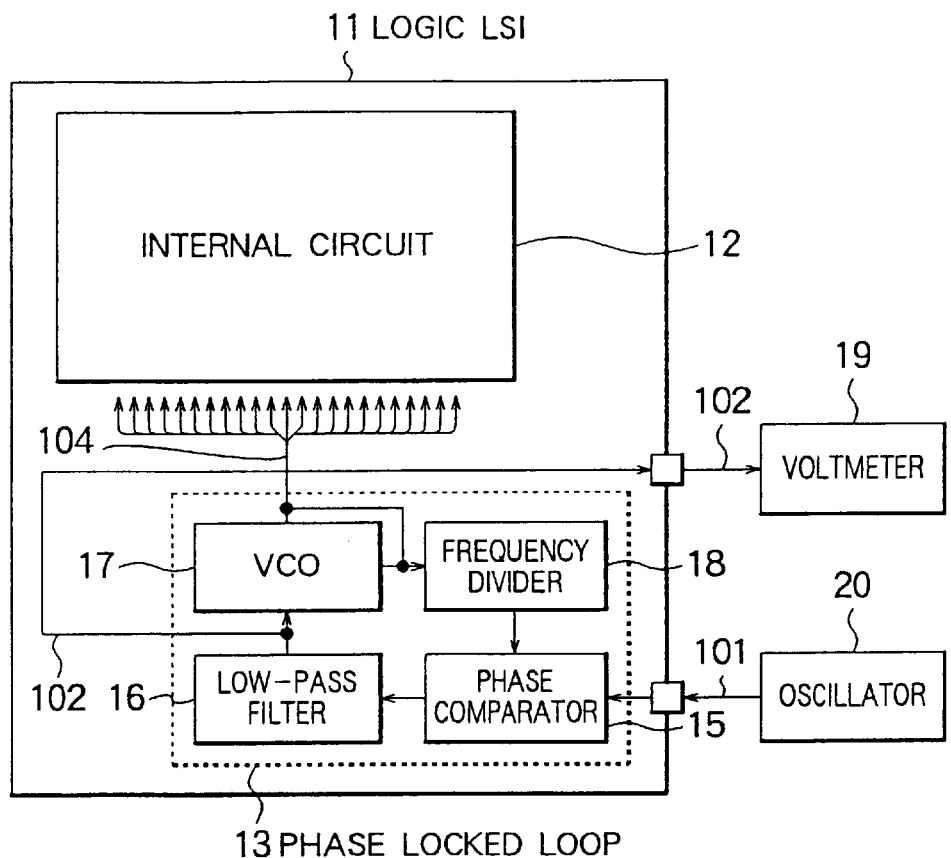
FIG. 3 is a block diagram of the conventional logic LSI of FIG. 1 under an evaluation test by an analog test circuit.
Figure 4:
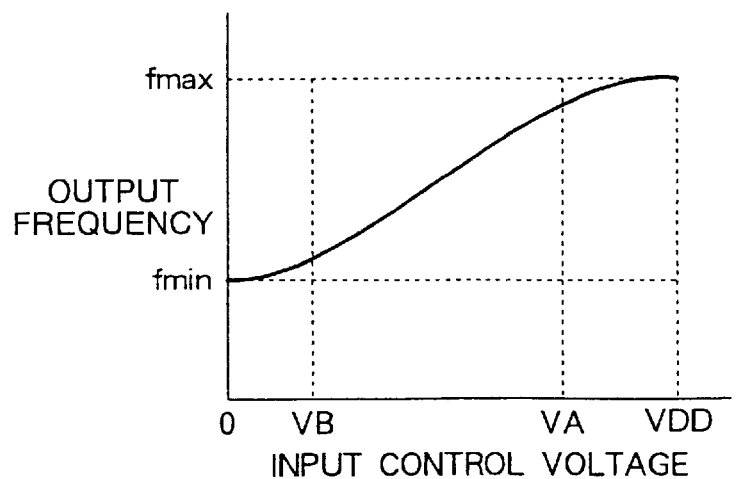
FIG. 4 is a typical graph for showing an oscillation frequency of a VCO plotted against an input control voltage thereof.

Now, the present invention is more specifically described with reference to accompanying drawings, wherein similar constituent elements are designated by the same or similar reference numerals.

Figure 6:
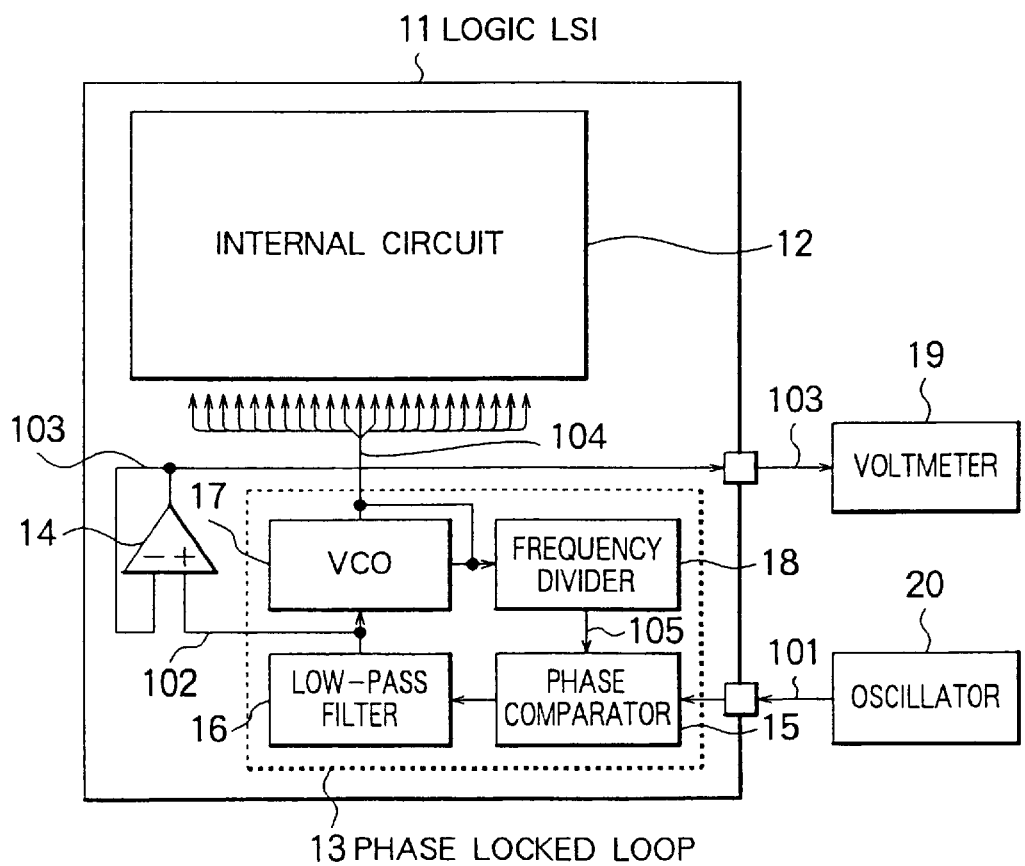
FIG. 6 is a block diagram of a logic LSI comprising a phase locked loop according to an embodiment of the present invention.

Referring to FIG. 6, there is shown a logic LSI comprising a phase locked loop according to an embodiment of the present invention, which is shown under a test by an analog test circuit. The logic LSI 11 comprises an internal circuit 12 having a specified function, such as for a microprocessor, the phase locked loop 13 for receiving an input clock signal to supply an internal clock signal 104 to the internal circuit 12, and an impedance converter 14 associated with the phase locked loop 13.

The phase locked loop 13 comprises a phase comparator 15 for comparing an internal signal 105 against an input clock signal, a low-pass filter 16 receiving an analog output from the phase comparator 15 to pass low-frequency components thereof, a voltage controlled oscillator (VCO) 17 controlled by an output 102 from the low-pass filter 16 to supply an internal clock signal 104 to the internal circuit 12, and a frequency divider 18 for dividing the internal clock signal 104 from the VCO 17 to provide the internal signal 105 to the comparator 15.

The analog test circuit comprises an oscillator 20 for supplying a test clock signal 101 to the phase comparator 15 of the phase locked loop 13 and a voltmeter 19 for measuring the output voltage of the low-pass filter 16 supplied through the impedance converter 14. The impedance converter 14 is implemented by an operational amplifier having a non-inverting input (+) connected to the output 102 of the low-pass filter 16 and an inverting input (−) connected to the output 103 of the operational amplifier 14 for a negative feed-back, thereby implementing a voltage follower configuration.

In the test mode of the logic LSI 11 of the present embodiment, the oscillator 20 of the analog test circuit supplies a test clock signal 101 having a frequency equal to a ratio of the internal clock frequency to the dividing ratio by the frequency divider 18. The phase comparator 15 compares the test clock signal 101 against the internal signal 105 supplied from the frequency divider 18 to deliver an analog signal representing the result of the comparison. The low-pass filter 16 passes low frequency components of the analog signal as a control signal for the VCO 17.

The VCO 17 generates an internal clock signal 104 having a frequency based on the control signal, and supplies the same to the internal circuit 12. The impedance converter 14 receives the output 102 of the low-pass filter 16 to supply an output voltage signal 103 having the same voltage level as the output 102 of the low-pass filter 16. The voltmeter 19 measures the output 103 of the impedance converter 14, and the result of the measurement is judged as to whether or not the measured voltage resides within a specified range between VB and VA such as described with reference to FIG. 5.

Figure 7:
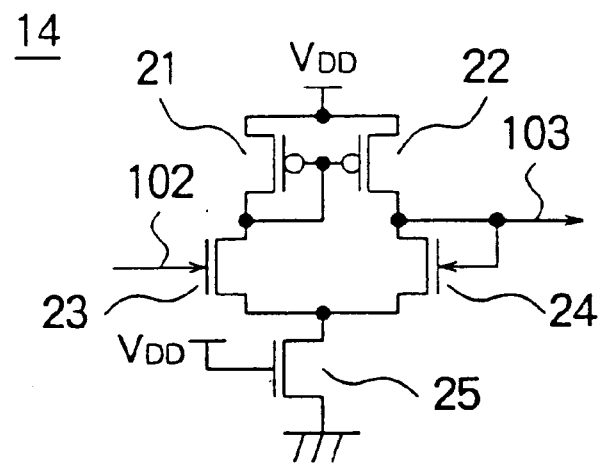
FIG. 7 is a schematic diagram of the voltage follower in FIG. 6 implemented by an operational amplifier.

Referring to FIG. 7, the operational amplifier 14 shown in FIG. 6 is implemented by a differential amplifier, which comprises a pair of p-channel transistors 21 and 22 constituting a current mirror, a pair of n-channel transistors 23 and 24 constituting a differential pair, and an n-channel transistor 25 connected between the common sources of the transistors 23 and 24 and the ground line. The n-channel transistor 25 has a gate maintained at a source potential VDD to thereby maintain the sum of the drain currents of the differential pair 23 and 24 at a constant. The gate of the first transistor 23 of the differential pair is connected to the input 102 of the voltage follower 14, and the gate of the second transistor 24 of the differential pair is connected to the drain thereof, i.e., the output 103 of the voltage follower 14 for a negative feed-back. In this configuration, if the input 102 of the differential pair rises to thereby increase the drain current of the first transistor 23 of the differential pair, the drain current of the second transistor 24 of the differential pair also increases by the function of the current mirror 21 and 22 to raise the output 103 of the voltage follower 14 up to the input voltage of the first transistor. The increase of the drain current of the second transistor 24 lowers the drain current of the first transistor 23 to the level at which both the drain currents become equal to each other.

Since the input 102 of the voltage follower 14 is connected to the gate of the first transistor 23, the input impedance of the voltage follower 14 is sufficiently high and the voltmeter 19 connected to the output thereof does not affect the output level of the low-pass filter 16. Accordingly, it is sufficient that the circuit elements of the low-pass filter 16 be determined based on the input impedance of the internal circuit 12 of the logic LSI 11 and the input capacitance of the voltage follower irrespective of the presence or absence of the voltmeter 19 to obtain desired frequency transmission characteristics of the low-pass filter 16.

Further, the MOSFETs of the voltage follower 14 may be formed in the process for fabricating other MOSFETs in the internal circuit 12 of the logic LSI 11. Accordingly, a special design or special process for the MOSFETs of the voltage follower 14 is not needed in the fabrication of the logic LSI 11.

Figure 8:
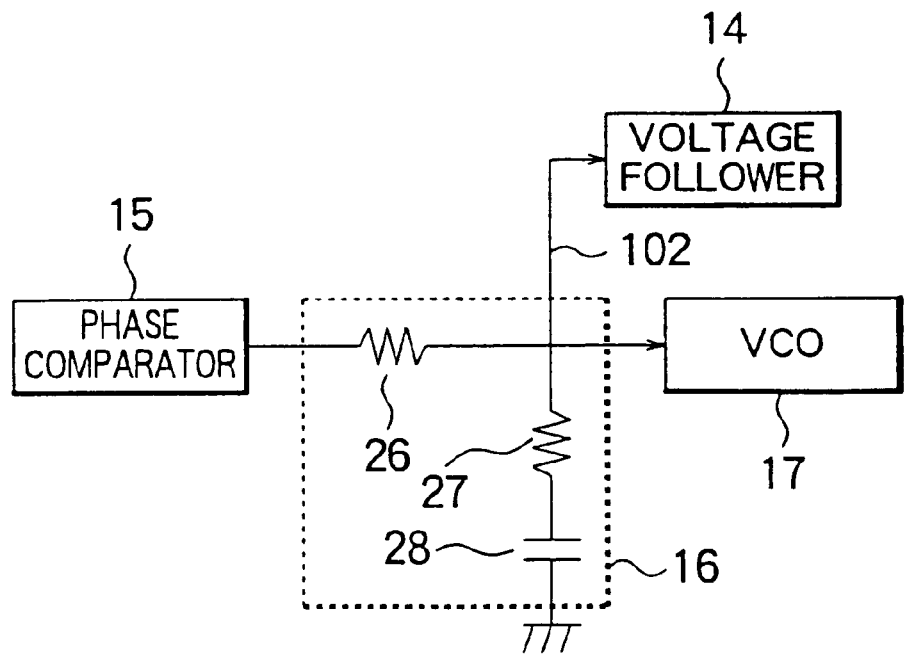
FIG. 8 is a schematic diagram of the low-pass filter in FIG. 5.

FIG. 8 shows a schematic diagram of the low-pass filter 16 together with other circuit elements in FIG. 6. The low-pass filter 16 comprises a first resistor 26 connected between the input and the output of the low-pass filter 16, and a combination of a first resistor 27 and a capacitor 28 serially connected together between the output of the low-pass filter 16 and the ground. The configuration of the low-pass filter 16 in the present embodiment is different from that of the low-pass filter in FIG. 1 in that the constituent elements of the low-pass filter 16 are determined in consideration of the input capacitance of the voltage follower (or difference amplifier) 14 in the present embodiment.

In the measurement by the analog test circuit, the voltmeter 19 connected to the output of the voltage follower 14 does not affect the function or characteristics of the phase locked loop, as described above. Accordingly, the characteristics of the phase locked loop 13 can be evaluated substantially as it is in the normal operation mode. The output of the voltage follower 14 is connected to a dedicated output pin allocated in the package of the logic LSI, thereby allowing the voltmeter 19 to directly measure the output of the voltage follower 14.

Figure 5:
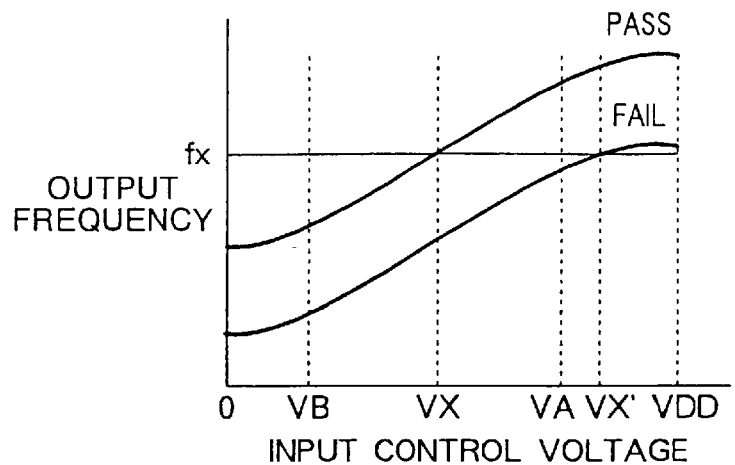
FIG. 5 is a graph for showing "pass" or "fail" of a phase locked loop.
Figure 9:
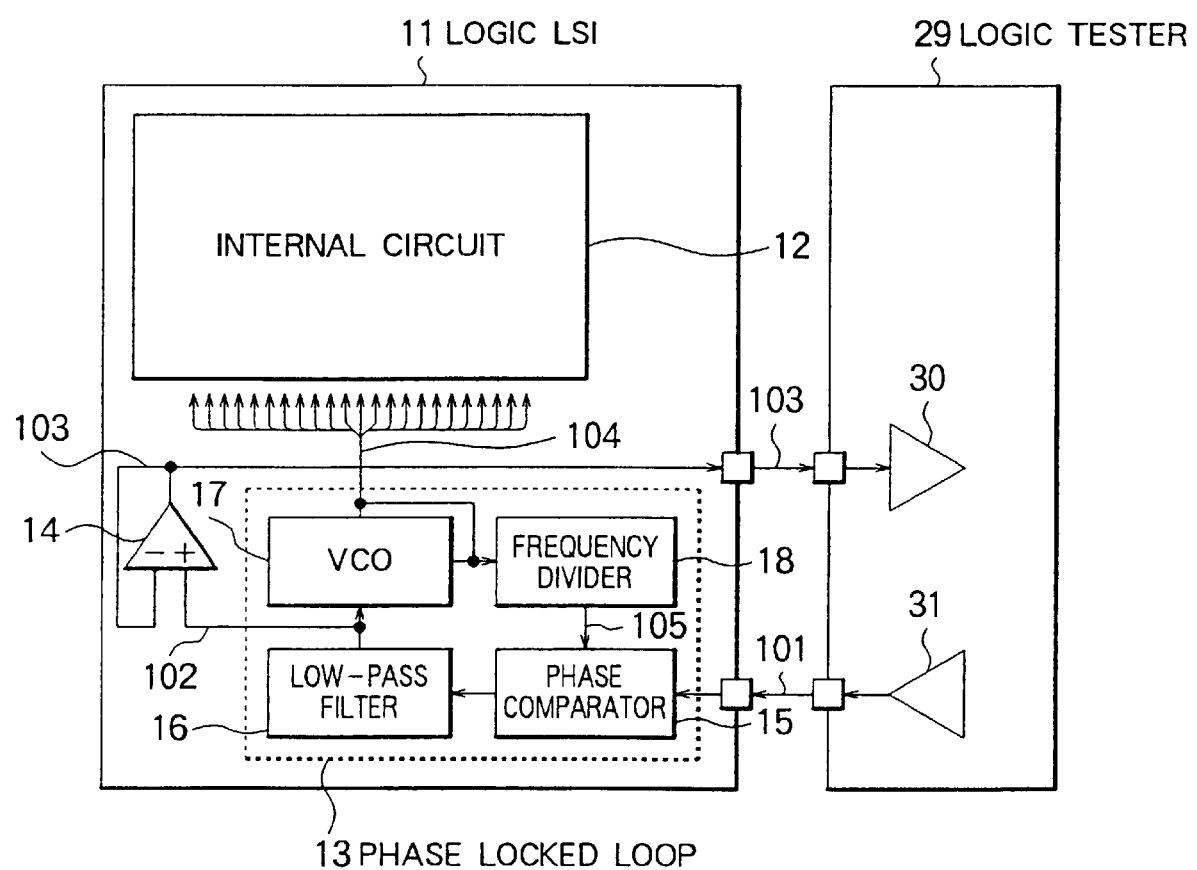
FIG. 9 is another block diagram of the logic LSI of FIG. 6 under an evaluation test by a logic tester.

Referring to FIG. 9, the logic LSI 11 of FIG. 6 is evaluated by a logic tester 29. The logic tester 29 comprises a driver 31 for supplying a test clock signal 101 to the phase comparator 15 of the logic LSI 11, and a voltage comparator 30 for receiving an output 103 from the voltage follower 14 to compare the output 103 of thee voltage follower 14 against a first reference voltage VA and a second reference voltage VB, such as shown in FIG. 5, thereby judging whether or not the output 103 of the voltage follower 14 resides within the range between VB and VA. The logic tester 29 then determines based on the result whether or not the output frequency of the phase locked loop 13 resides within the specified range. With this configuration, the logic LSI 11 can be tested both by the analog and logic testers without affecting the characteristics of the phase locked loop.

Since the above embodiments are described only for examples, the present invention is not limited to the above embodiments and various modifications or alterations can be easily made therefrom by those skilled in the art without departing from the scope of the present invention.

What is claimed is:

1. A semiconductor integrated circuit comprising: an internal circuit having a specified function; a phase locked loop having a phase comparator for comparing an input clock signal against an internal signal in phase to output a phase difference signal, a low-pass filter for passing low-frequency components of said phase difference signal as a first signal, a voltage controlled oscillator (VCO) for receiving said first signal to output an internal clock signal to said internal circuit based on a voltage level of said first signal, and a frequency divider for dividing said internal clock signal to output said internal signal; and an impedance converter for receiving said first signal at a first impedance to output a test evaluation signal to be supplied substantially without affecting said first impedance.

2. A semiconductor integrated circuit as defined in claim 1, wherein said impedance converter is implemented by a voltage follower.

3. A semiconductor integrated circuit as defined in claim 2, wherein said voltage follower comprises a pair of differential transistors including a first transistor and a second transistor, said first transistor receiving said first signal, said second transistor outputting said test evaluation signal and receiving said test evaluation signal as a negative feed-back, a current mirror including a third transistor and a fourth transistor each connected in series with a corresponding one of said first and second transistor, and a fifth transistor for maintaining a sum of drain currents of said first and second transistors substantially at a constant.

4. A semiconductor integrated circuit as defined in claim 1, further comprising an external pin for passing said test evaluation signal toward outside said semiconductor integrated circuit.

5. A semiconductor integrated circuit as defined in claim 1, wherein said semiconductor integrated circuit is implemented as a single chip.

6. A semiconductor integrated circuit as defined in claim 1, wherein said impedance converter outputs said test evaluation signal at a voltage level substantially same as a voltage level of said first signal.

7. A method for correcting a test signal output from a semiconductor integrated circuit, said circuit including an internal circuit for performing a predetermined function, a phase comparator, a low-pass filter connected to an output of the phase comparator, a voltage-controlled oscillator connected to an output of the low-pass filter, and a frequency divider having an input connected to the voltage-controlled oscillator and an output connected to the phase comparator, said method comprising steps of:

comparing an input clock signal against an internal signal to generate a phase different signal;

passing a predetermined portion of said phase difference signal using said low-pass filter, said predetermined portion passed being a first signal;

outputting an internal clock signal to an internal circuit based on a voltage level fo said first signal;

dividing said internal clock signal to output said internal signal; and performing an impedance converting step including receiving said signal at a first impedance to output a test evaluation signal supplied substantially without affecting said first impedance.

* * * * *